(12) United States Patent
Ryan

(10) Patent No.: US 6,919,636 B1
(45) Date of Patent: Jul. 19, 2005

(54) INTERCONNECTS WITH A DIELECTRIC SEALANT LAYER

(75) Inventor: E. Todd Ryan, Wappingers Falls, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 57 days.

(21) Appl. No.: 10/630,809

(22) Filed: Jul. 31, 2003

(51) Int. Cl.⁷ .................. H01L 23/48; H01L 23/52; H01L 29/40
(52) U.S. Cl. .................. 257/751; 257/752; 257/753; 257/759; 257/761; 257/762; 257/768; 257/773
(58) Field of Search ............... 257/751–753, 257/759, 761, 762, 768, 773

(56) References Cited

U.S. PATENT DOCUMENTS

| | | | |
|---|---|---|---|
| 6,051,321 A * | 4/2000 | Lee et al. ............ | 428/447 |
| 6,184,407 B1 | 2/2001 | Yoshitake et al. | |
| 6,358,838 B2 * | 3/2002 | Furusawa et al. ...... | 438/622 |
| 6,531,621 B1 | 3/2003 | Dorsch et al. | |
| 6,663,973 B1 * | 12/2003 | Lee et al. ............ | 428/447 |
| 6,680,541 B2 * | 1/2004 | Furusawa et al. ...... | 257/759 |
| 6,777,325 B2 * | 8/2004 | Ryuzaki et al. ....... | 438/637 |
| 6,803,314 B2 * | 10/2004 | Quek et al. .......... | 438/689 |
| 2001/0009295 A1 * | 7/2001 | Furusawa et al. ...... | 257/635 |
| 2002/0105085 A1 * | 8/2002 | Furusawa et al. ...... | 257/759 |
| 2004/0094839 A1 * | 5/2004 | Fitzsimmons et al. ... | 257/758 |
| 2004/0224494 A1 * | 11/2004 | Clevenger et al. ..... | 438/622 |
| 2005/0023689 A1 * | 2/2005 | Nicholson et al. ..... | 257/758 |

* cited by examiner

*Primary Examiner*—David E. Graybill

(57) ABSTRACT

Leakage, capacitance and reliability degradation of interconnects fabricated in low-k dielectric materials, particularly porous low-k dielectric material, due to penetration by a barrier metal and/or barrier metal precursor during damascene processing is prevented by depositing a conformal, heat stable dielectric sealant layer on sidewalls of the low-k dielectric material defining the damascene opening. Embodiments include forming a dual damascene opening in a porous, low-k organosilicate layer, the organosilicate having a pendant silanol functional group, depositing a siloxane polymer having a silylating functional group which bonds with the pendant silanol group to form the sealant layer, depositing a Ta and/or TaN barrier metal layer by CVD or ALD and filling the opening with Cu or a Cu alloy.

8 Claims, 6 Drawing Sheets

R =OH
R'=OCH3

INTERCONNECTS WITH A DIELECTRIC SEALANT LAYER

FIELD OF THE INVENTION

The present invention relates to a method of manufacturing a semiconductor device exhibiting increased operating speed and improved reliability. The present invention has particular applicability in manufacturing high density, multi-level semiconductor devices comprising sub-micron dimensioned interconnects formed with high precision and improved reliability.

BACKGROUND ART

Interconnection technology is constantly challenged to satisfy the ever increasing requirements for high density and performance associated with ultra large scale integration semiconductor devices. The speed of semiconductor circuitry varies inversely with the resistance (R) and capacitance (C) of the interconnection system. The higher the value of the R×C product, the more limiting the circuit speed. As integrated circuits become complex and feature sizes and spacings become smaller, the integrated circuit speed becomes less dependent upon the transistor itself and more dependent upon the interconnection pattern. Thus, the performance of multi-level interconnects is dominated by interconnect capacitance at deep sub-micron regimes, e.g., less than about 0.12 micron. The rejection rate due to integrated circuits speed delays in sub-micron regimes has become a limiting factor in fabrication.

One way to increase the control speed of semiconductor circuitry is to reduce the resistance of a conductive pattern. Copper (Cu) is considered a viable alternative to aluminum (Al) for metallization patterns, particularly for interconnect systems having smaller dimensions. Cu has a lower bulk resistivity and potentially higher electromigration tolerance than Al. Both the lower bulk resistivity and higher electromigration tolerance improve circuit performance. A conventional approach to forming a Cu interconnection involves the use of damascene processing in which openings are formed in an interlayer dielectric (ILD) and then filled with Cu. Such damascene techniques typically include single as well as dual damascene techniques, the latter comprising forming a via opening in communication with a trench opening and simultaneously filling by metal deposition to form a via in communication with a metal line.

However, Cu is a mid-gap impurity in silicon and silicon dioxide. Accordingly, Cu diffusion through interlayer dielectrics, such as silicon dioxide, degrades the performance of the integrated circuit. A conventional approach to the diffusion problem comprises depositing a barrier material to encapsulate the Cu line. Typically diffusion barrier materials include tantalum (Ta), tantalum nitride (TaN), titanium nitride (TiN), and titanium tungsten (TiW) for encapsulating Cu. The use of such barrier materials to encapsulate Cu is not limited to the interface between the Cu and the ILD, but includes interfaces with other metals as well. In depositing Cu by electroless deposition or electroplating, a seedlayer is also typically deposited to catalyze electroless deposition or to carry electric current for electroplating. For electroplating, the seedlayer must be continuous. However, for electroless plating, very thin catalytic layers can be employed in the form of eyelets.

Conventional Cu interconnect methodology typically comprises planarizing after Cu deposition, as by chemical-mechanical polishing (CMP), such that the upper surfaces of the filled trenches are substantially coplanar with the upper surface of the ILD. Subsequently a capping layer, such as silicon nitride or silicon carbide, is deposited to complete encapsulation of the Cu inlaid metallization.

The dielectric constant (k) of materials currently employed in the manufacture of semiconductor devices for an interlayer dielectric (ILD) ranges from about 3.9 for dense silicon dioxide to over 8 for deposited silicon nitride. The value of the dielectric constant (k) expressed herein is based upon a value of one (1) for a vacuum. In an effort to reduce interconnect capacitance, dielectric materials with lower values of permitivity have been employed. The expression "low-k" material has evolved to characterize materials with a dielectric constant less than about 3.9, e.g., less than 3.5. Various low-k dielectric materials, rules as porous low-k dielectric materials, e.g., dielectric materials having a porosity of 1% to 70%, offer promise, for example, such as porous SiLK™ available from Dow Chemical, located in Midland, Mich., and JSR5108 or JSR5109 available from JSR, located in Japan.

In attempting to employ various low-k materials, particularly porous low-k dielectric materials in interconnect technology, as for a dielectric layer in damascene techniques, various issues arise. For example, upon forming an opening in a porous dielectric material, such as a single or dual damascene opening, the sidewalls defining the opening have exposed pores. Upon depositing a conventional barrier layer material, such as Ta and/or TaN, when implementing Cu interconnect technology, chemical vapor deposition (CVD) or atomic layer deposition (ALD) may be employed so that the barrier layer is deposited in a conformal manner. However, deposition precursors usually diffuse into such porous ILD materials and deposit metal in the pores throughout the ILD film, thereby causing leakage and capacitance degradation. This problem is particularly acute in porous films where the pores are completely interconnected. This problem may also occur when employing non-porous low-k materials in situations where the CVD or ALD precursors diffuse into the ILD material and are trapped, thereby causing leakage and capacitance degradation.

Accordingly, a need exists for methodology enabling the fabrication of semiconductor devices having reliable interconnects, based on low-k ILDs, with uniformly deposited barrier metal layers without barrier metal penetration and/or diffusion into the low-k ILDs. A particular need exists for methodology enabling the fabrication of such semiconductor devices having copper (Cu) or Cu alloy interconnects using low-k porous dielectric materials.

DISCLOSURE OF THE INVENTION

An advantage of the present invention is a method of manufacturing a semiconductor device exhibiting reduced parasitic R×C time delays comprising low-k dielectric materials, particular porous low-k dielectric materials, without barrier metal and/or barrier metal precursor penetration into the low-k material.

Another advantage of the present invention is a semiconductor device having interconnection patterns exhibiting reduced parasitic R×C time delays comprising low-k dielectric materials, particular porous low-k dielectric materials, without barrier metal and/or barrier metal precursor penetration into the low-k material.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an opening in a dielectric layer, comprising a low-k material having a pendant functional group, overlying a lower conductive feature, the opening defined by sidewalls of the low-k dielectric layer; depositing a sealant layer of a dielectric material on the sidewalls of the low-k dielectric layer, the dielectric material having a functional group which bonds to the pendant functional group of the low-k material; depositing a barrier metal layer lining the opening and on the sealant layer; and filling the opening with a conductive material, wherein the sealant layer prevents the barrier metal or a precursor used to deposit the barrier metal from penetrating the low-k material.

Embodiments of the present invention include forming a dual damascene opening in a porous, organosilicate low-k interlayer dielectric (ILD), the porous organosilicate comprising a pendant silanol functional group, depositing a siloxane polymer having a silylating functional group which reacts with the pendant silanol functional group of the organosilicate to form a sealant layer having a thickness from less than about 10 Å to about 100 Å, depositing a Ta and/or TaN barrier metal by CVD or ALD lining the opening and on the sealant layer, and filling the opening with Cu or Cu alloy. Embodiments of the present invention further include depositing a seedlayer on the barrier metal layer and filling the opening with Cu or Cu alloy by electroplating. Embodiments of the present invention also include conducting chemical-mechanical polishing (CMP) after depositing the Cu or Cu alloy, and then depositing a capping layer, such as silicon nitride or silicon carbide.

Another aspect of the present invention is a semiconductor device comprising: an interlayer dielectric (ILD), comprising a low-k material having a pendant functional group, overlying a lower conductive feature; an opening in the ILD overlying the lower conductive feature, the opening defined by sidewalls of the low-k material; a sealant layer on the side surfaces of the low-k material, the sealant layer comprising a dielectric material having a functional group bonded to the pendant functional group of the low-k material; a barrier metal layer lining the opening and on the sealant layer; and a conductive material filling the opening.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded and illustrative in nature, and not as restrictive.

DESCRIPTION OF THE INVENTION

Figure 1A:
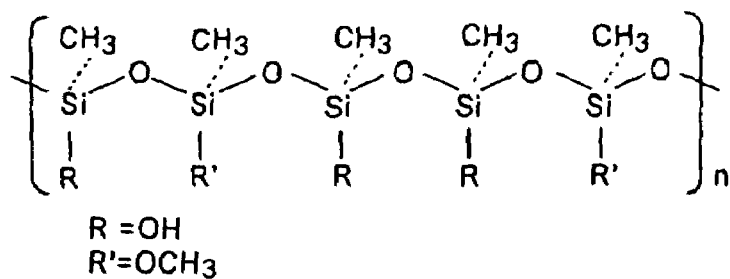
FIGS. 1A–1C illustrate siloxane polymers with Si-OCH$_3$ functional groups suitable for use in the present invention.

The present invention addresses the problem of barrier metal and/or barrier metal precursor penetration through sidewalls and into a low-k material during damascene processing, particularly porous low-k material. It was found that during CVD and ALD deposition of a thin conformal barrier metal layer, such as Ta and/or TaN, prior to the filling damascene openings with Cu or a Cu alloy, the barrier metal and/or precursor penetrated through the sidewalls of the low-k dielectric layer. Such penetration was particularly acute in implementing damascene processing employing porous low-k materials, such as porous low-k dielectric material having a dielectric constant (k) less than about 2.5. Such penetration into the low-k material causes leakage and capacitance degradation. This problem is not confined to porous low-k material, but may also occur with non-porous low-k material by diffusion of the barrier metal and/or barrier metal precursor through the exposed sidewalls into the low-k material.

The present invention addresses solving that problem by depositing a thin, conformal dielectric sealant layer on the sidewalls of the trenches and vias of a damascene opening, such as a dual damascene opening. The sealant layer is strategically selected from dielectric materials having a functional group capable of reacting with a pendant functional group on the low-k material. For example, there are various mesoporous organosilicate glass (OSG) materials employed as ILDs in fabricating semiconductor devices. Such OSG films have many silanol groups distributed throughout, including on pore walls. By depositing a conformal dielectric layer, such as a thermally stable siloxane polymer, which contains a silylating functional group which reacts with the pendant silanol functional groups of the low-k material, the sealant polymer is bound to the low-k material along the sidewall. Preferably, the functional groups are positioned on the ends of the polymer chain of the sealant polymer to minimize diffusion of the sealant polymer into the porous low-k film thereby forming a flat thin layer along the sidewalls across the pores.

The present invention exploits the existence of reactive functional groups, available on the surface and within the pores of porous low-k ILDs. These reactive groups are the by-product of forming particular low-k ILDs and/or are formed based on a by-product of etching a formed ILD. For example, mesoporous organosilicate-based glass, as well as other siloxy or silicate-based dielectric materials, have pendent hydroxyl or alkoxy groups, e.g., methoxy or ethoxy groups, available for further chemical reactions. These reactive groups are available on the surface of the dielectric layer as well as within the pore walls. Functional polymeric materials can be applied to the ILD to react with and chemically bind to these pendant reactive groups on the surface and within the pores of ILDs. As used herein, a functional polymer includes one that will readily undergo chemical bonding with a surface group on an ILD. For example, functional polymers which have groups that undergo hydrolysis or condensation-type reactions, such as silanol, silyl ether, silyl alkoxy, silylhalide, silazane, etc., are among those that can be used in the present invention.

In one aspect of the present invention, a functional polymer is applied to the superficial surface of an ILD to seal or clog the surface and pores of the porous dielectric by chemically reacting the functional groups of the polymer with pendant groups on the ILD. Polymeric materials with functional groups that can be employed in embodiments of the present invention include organopolysiloxanes terminated with one or more alkoxy groups, e.g., polydimethyl siloxanes or polydiphenyl siloxanes having one or a plurality of methoxy or ethoxy terminated end-groups; organopolysiloxanes having one or more functional groups pendant along the backbone of the polymer, e.g., polydiemethyl siloxane co-diethoxysiloxane.

Functional polymers of the present invention include homopolymers, random polymers, block polymers, and polymers having linear, branched, star and dendritic structures. The functional polymers of the present invention can have any molecular weight distribution, stereochemical configuration and molecular weight. In an embodiment of the present invention, the functional polymer has a structure and/or molecular weight such that its size approaches that of the average size of the pores of the ILD.

Organopolysiloxane terminated with alkoxy groups are known, see, e.g., 6,531,621. Organosilicon polymers containing a plural number of silicon-bonded alkoxy groups in each molecule are known to be useful as coatings. Functional groups present at the branch terminals of a dendrimer are also known, see, e.g., 6,184,407. Examples of suitable functional polymers include dimethoxy terminated polydimethyl siloxane and diglycidyl ether terminated polydimethyl siloxane, both available from Sigma-Aldrich Co. of St. Louis, Mo.

Polymers bearing reactive functional groups can be spin-coated on to the ILD at room temperatures under atmospheric pressure. In one embodiment of the present invention, the functional polymer is spin coated on to the ILD and then completely baked to remove excess solution and accelerate chemical reaction. Radiant heat and/or under a partial pressure, e.g., a vacuum, may also be used to facilitate the chemical reaction between the ILD and the polymer and to remove reaction by products.

The OSG dielectric material can contain pores having a diameter of less than about 10 Å to about 100 Å, which pores can be interconnected. The sealant layer is typically deposited at a thickness of about 10 Å to about 100 Å, e.g., 10 Å to 20 Å. Advantageous results can be achieved by depositing the conformal sealant layer as thin as possible while serving its function of preventing entry of the barrier metal and/or barrier metal precursor into the ILD and, hence, preventing leakage and capacitance degradation.

The siloxane polymer suitable for use in accordance with the present invention may comprise either a flexible, linear chain, a dendrimer or star-polymer, or a siloxane ring. Desirably, the polymers are thermally stable, i.e., they do not decompose at temperatures up to about 425° C.

Suitable materials for use as the porous low-k ILD include JSR LKD-5108 and 5109 available from JSR located in Japan and porous silk SiLK™ available from Dow Chemical located in Midland, Mich.

Figure 1B:
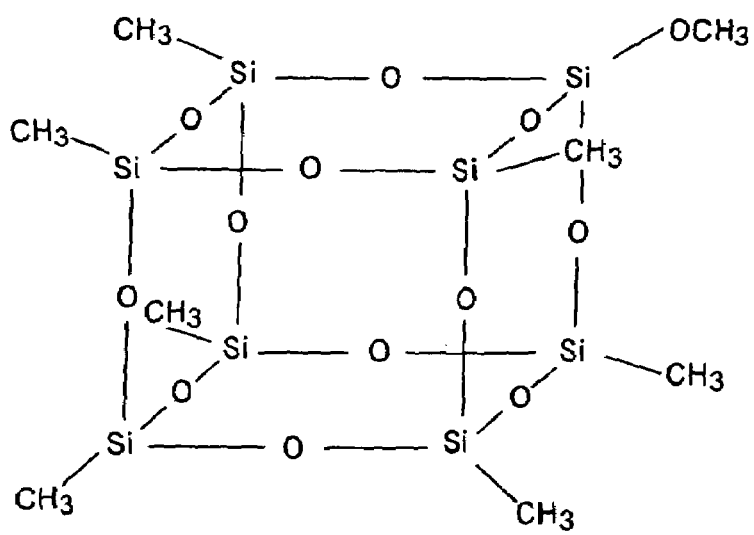
Figure 1C:
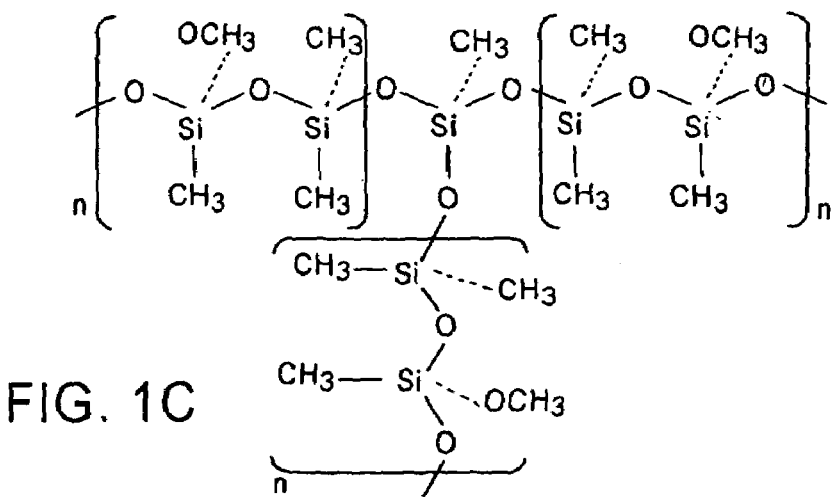

FIGS. 1A, 1B and 1C exemplify suitable siloxane polymers with Si-OCH$_3$ functional groups for silylating silanol pendant functional groups on an OSG sidewall. FIG. 1A schematically illustrates a linear, flexible chain; FIG. 1B illustrates a cage structure; and FIG. 1C illustrates a star-polymer.

Figure 2:
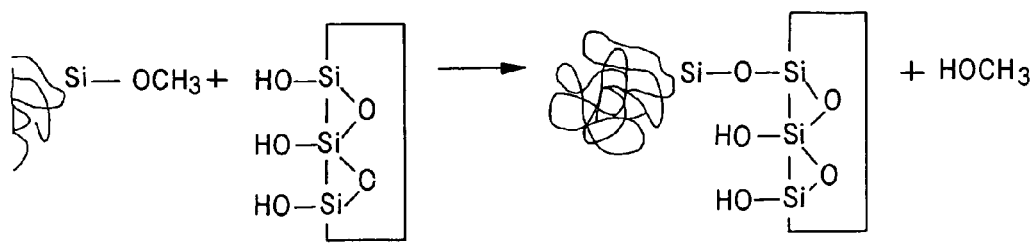
FIG. 2 illustrates a silylation reaction between a functionalized siloxane polymer and silanol pendant groups in accordance with an embodiment of the present invention.

FIG. 2 exemplifies a silylation reaction between a suitably functionalized siloxane polymer and silanol functional groups on an OSG sidewall. Reaction will chemically bind the siloxane sealant polymer to the sidewall. Advantageously, the siloxane polymer may be functionalized so that deposition resembles a self-assembled monolayer (SAM) process.

Figure 3:
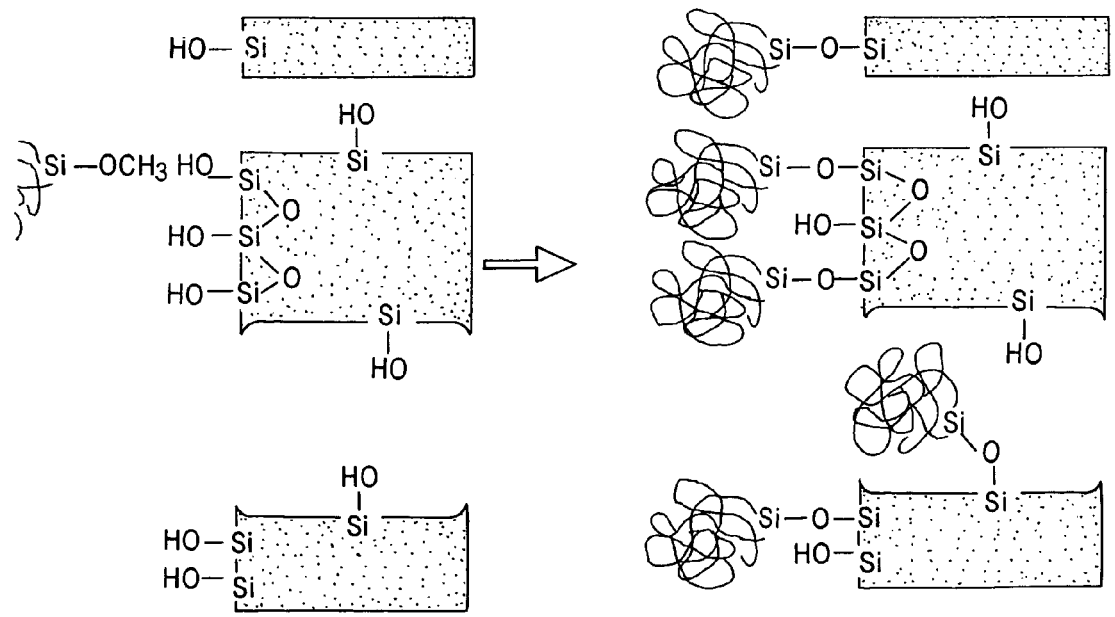
FIG. 3 schematically illustrates how a siloxane sealant clogs pores of a porous sidewall by a silylation reaction in accordance with an embodiment of the present invention.

FIG. 3 schematically illustrates how a siloxane sealant clogs pores at the surface of a porous OSG sidewall. As exemplified, a methoxy functional group reacts with a pendant silanol functional group of a porous sidewall by a silylation reaction.

Figure 4:
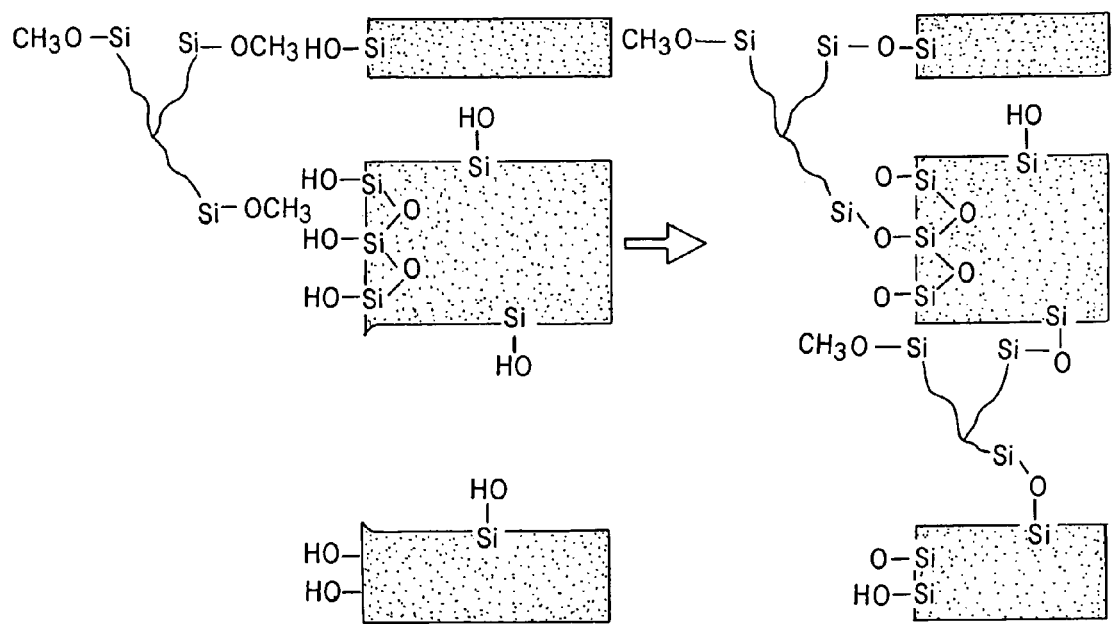
FIG. 4 schematically illustrates how a siloxane sealant clogs pores at the surface of a porous sidewall in accordance with another embodiment of the present invention.
Figure 4:
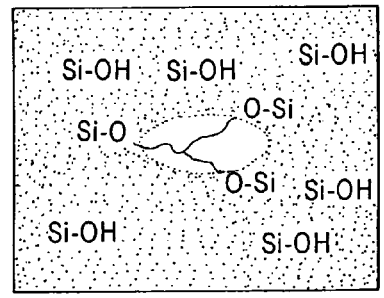

FIG. 4 schematically illustrates how a siloxane sealant clogs pores at the surface of a porous OSG sidewall (top) employing a star-polymer with functionalized ends. As exemplified, a methoxy functional group reacts with a pendant silanol functional group on the porous sidewall by a silylation reaction. The bottom illustration shows how such a polymer covers over a pore depending on the size of the polymer and pore.

Figure 5:
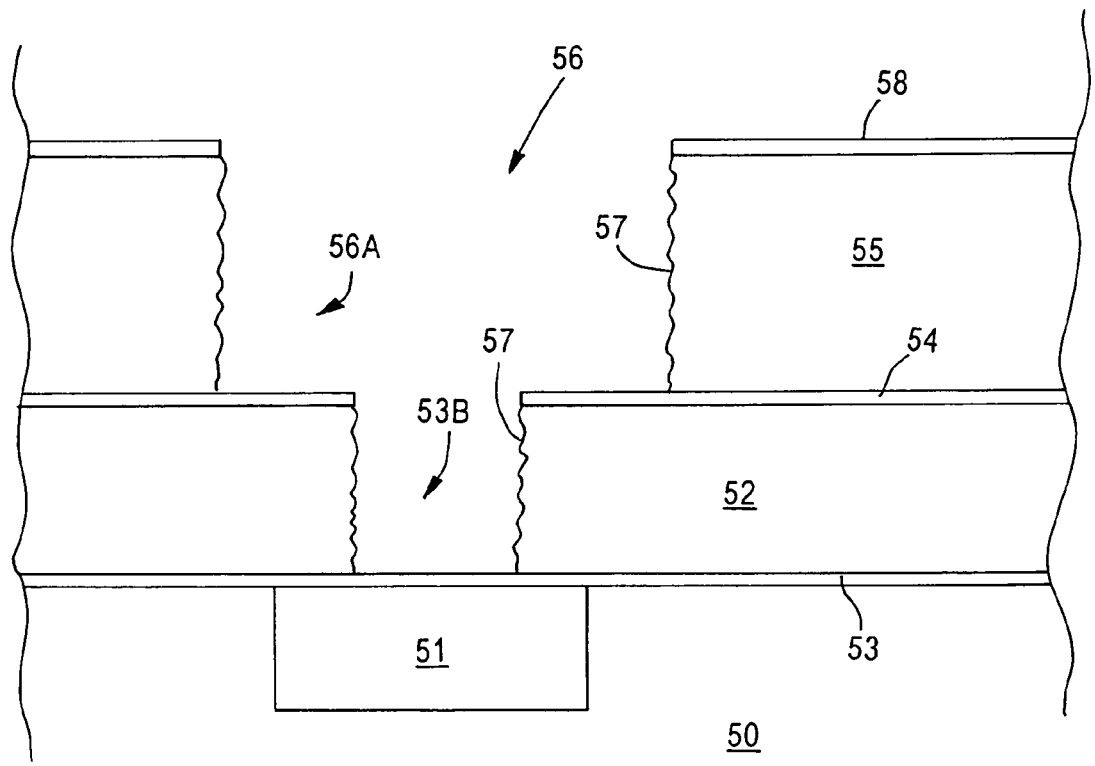
FIGS. 5 through 7 schematically illustrate sequential phases of a method in accordance with an embodiment of the present invention.
Figure 6:
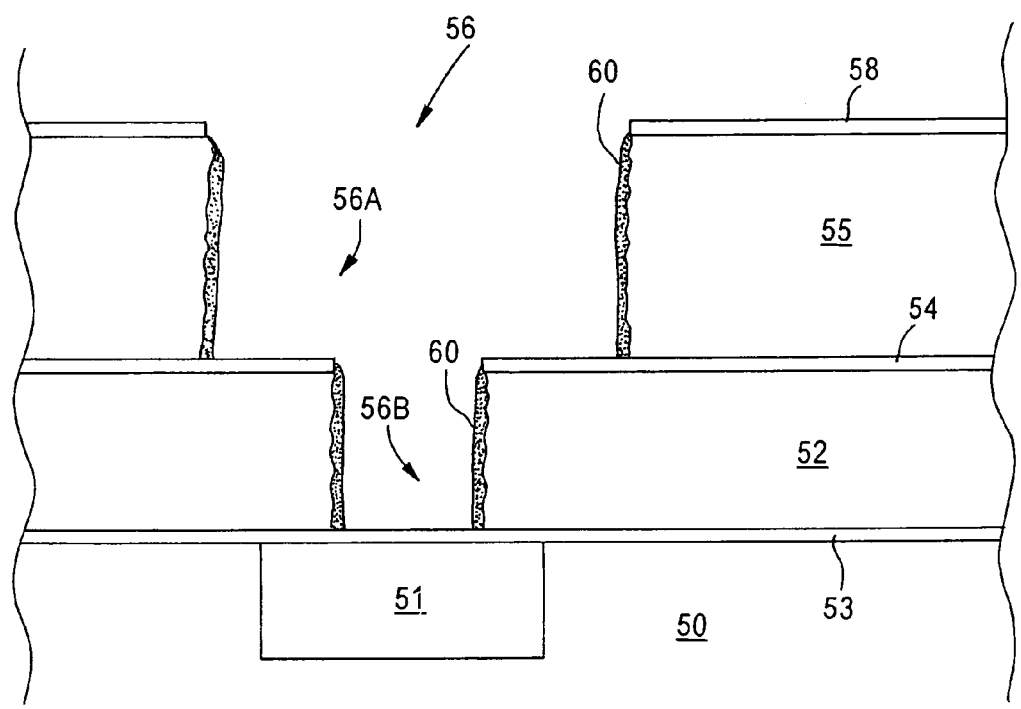
Figure 7:
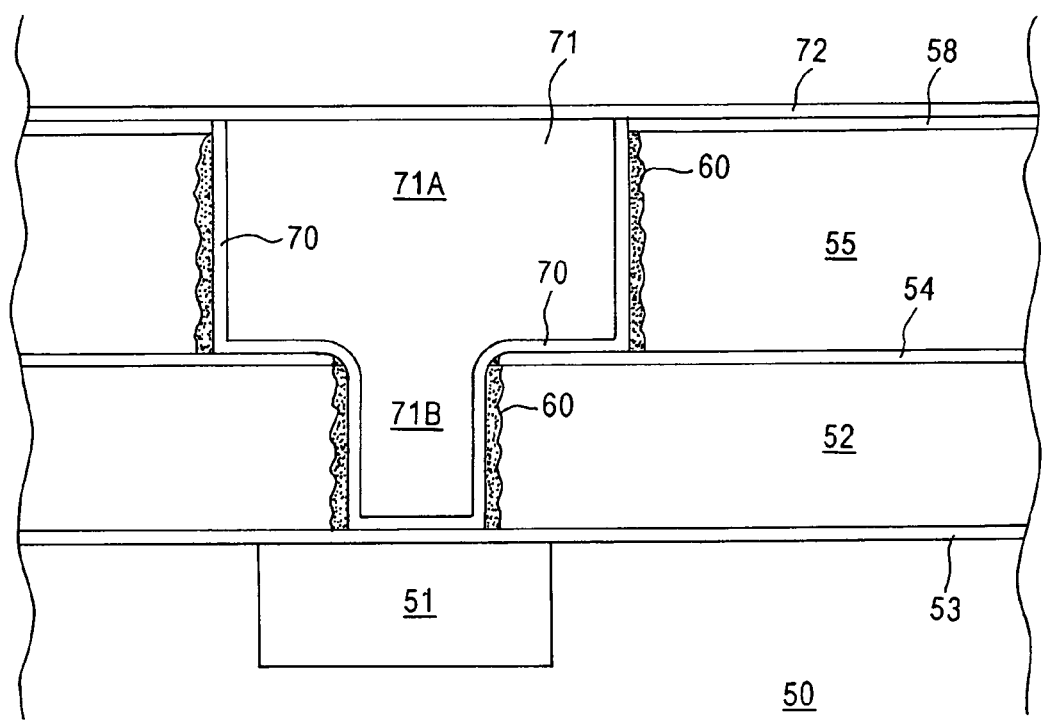

An embodiment of a method in accordance with an embodiment of the present invention is schematically illustrated in FIGS. 5 through 7, wherein similar features are denoted by similar reference characters. Adverting to FIG. 5, an underlying conductive feature 51, which could be a metal line in the dielectric layer 50 overlying a substrate (not shown), with a capping layer 53 thereon. The capping layer 53 can comprise silicon nitride or silicon carbide. Porous low-k dielectric layers 52 and 55 are sequentially deposited with an intermediate etch-stop layer 54, such as silicon nitride. A hard mask 58, such as silicon nitride, silicon carbide or silicon oxynitride is formed thereon. A dual damascene opening 56 is then formed comprising a lower via hole section 56B in an upper trench 56A. The porous low-k layers 52 and 55 may comprise a porous organosilicate having a pendant silanol group. The sidewalls 57 of low-k layers 52 and 55 contain exposed pores through which a subsequently deposited barrier metal and/or barrier metal precursor would normally penetrate, thereby causing leakage and capacitance degradation.

In accordance with the embodiments of the present invention, however, such penetration is prevented by depositing a thermally stable, conformal dielectric sealant layer 60, as by selective deposition on the exposed sidewalls of low-k layers 52 and 55. For example, a thin conformal layer of about 10 Å to about 20 Å of a siloxane polymer containing a silylating functional group, such as a methoxy group, is deposited, by spin coating, whereby the silylating group reacts with the pendant functional silanol groups of organosilicate layers 52 and 55. Unreacted sealant material is then rinsed away by an appropriate solvent, thereby resulting in the selective deposition of a bonded conformal sealant layer 60 on the exposed sidewalls of the porous organosilicate 52 and 55 effectively clogging the pores and preventing penetration of a subsequently deposited barrier metal and/or barrier metal precursor therein.

Subsequently, as illustrated in FIG. 7, a barrier metal layer 70 is deposited. Because the sealant layer 60 prevents penetration by barrier metal, CVD and ALD deposition techniques can advantageously be used to deposit a thin, conformal layer of barrier metal, such as Ta and/or TaN. Subsequent processing is implemented in a conventional manner, as by depositing a layer of Cu or Cu alloy 70 and conducting CMP followed by deposition of a capping layer 72, such as silicon nitride or silicon carbide. As shown, the interconnect 71 comprises an upper Cu or Cu alloy line 71A connected to underlying via 71B which is electrical contact with the underlying conductive feature 51.

The present invention, therefore, enables integration of CVD and ALD deposited barrier layers with porous low-k films by preventing metal penetration into the low-k films. Advantageously, a thin sealant layer is deposited on the sidewalls of the trenches and vias, as by a spin-on process. Since the sealant layer bonds with functional groups on the low-k material, an extremely conformal layer is conformed.

The present invention provides methodology enabling the fabrication of semiconductor devices having highly reliable interconnects. The present invention is particularly applicable in forming microminiaturized interconnects based on damascene technology comprising porous low-k ILDs and highly conformal barrier metal layers deposited by CVD and ALD without barrier metal penetration into the ILDs, thereby improving overall device reliability, reducing capacitance, increasing operating speed, and improving accuracy and precision.

The present invention enjoys industrial applicability in manufacturing highly integrated semiconductor devices exhibiting increased circuit speed and sub-micron dimensions, e.g., with a design rule of about 0.12 micron and under.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A semiconductor device comprising:
   an interlayer dielectric (ILD), comprising a low-k material having a pendant functional group, overlying a lower conductive feature;
   an opening in the ILD overlying the lower conductive feature, the opening defined by sidewalls of the low-k material;
   a sealant layer on the side surfaces of the low-k material, the sealant layer comprising a dielectric material having a functional group bonded to the pendant functional group of the low-k material;
   a barrier metal layer lining the opening and on the sealant layer; and
   a conductive material filling the opening.

2. The semiconductor device according to claim 1, wherein:
   the opening is a dual damascene opening;
   the barrier metal layer comprises Ta and/or TaN;
   the conductive material is copper (Cu) or a Cu alloy; and
   a capping layer is on an upper surface of the Cu or Cu alloy.

3. The semiconductor device according to claim 1, wherein the sealant layer is a heat stable, conformal layer having a thickness of about 10 Å to about 100 Å.

4. The semiconductor device according to claim 1, wherein the low-k material is a porous material comprising pores having a diameter of about 10 Å to about 100 Å.

5. The semiconductor device according to claim 4, wherein the pores are interconnected.

6. The semiconductor device according to claim 1, wherein the low-k material comprises a porous organosilicate.

7. The semiconductor device according to claim 6, wherein the sealant layer comprises a siloxane polymer.

8. The semiconductor device according to claim 7, wherein the siloxane polymer comprises a silylating functional group bonded to a pendant silanol functional group on the organosilicate.

* * * * *